United States Patent [19]
Cantrell et al.

[11] Patent Number: 5,387,825
[45] Date of Patent: Feb. 7, 1995

[54] GLITCH-ELIMINATOR CIRCUIT

[75] Inventors: Jay T. Cantrell, Dallas; Edward R. Schurig, Plano, both of Tex.

[73] Assignee: Texas Instruments Incorporated, Dallas, Tex.

[21] Appl. No.: 932,476

[22] Filed: Aug. 20, 1992

[51] Int. Cl.6 .................................... H03K 17/16
[52] U.S. Cl. ............................. 326/26; 326/21; 326/93; 327/292; 327/551
[58] Field of Search ............ 307/480, 269, 443, 272.1, 307/596

[56] References Cited

U.S. PATENT DOCUMENTS

| | | | |
|---|---|---|---|
| 4,748,417 | 5/1988 | Spengler | 307/480 |
| 4,929,850 | 5/1990 | Breuninger | 307/480 |
| 4,972,518 | 11/1990 | Matsuo | 307/480 |
| 5,029,279 | 7/1991 | Sasaki et al. | 307/480 |

*Primary Examiner*—Edward P. Westin
*Assistant Examiner*—Andrew Sanders
*Attorney, Agent, or Firm*—Mark A. Valetti; Robby T. Holland; Richard L. Donaldson

[57] ABSTRACT

One embodiment of the present invention is a digital circuit (10) for providing glitch-free data in an asynchronous environment, the circuit comprising: an input circuit (11) for accepting data; combinational logic circuitry (12) for accepting the data from the input circuit (11) and manipulating the data to provide output data, wherein a delay in data flow occurs while the combinational logic manipulates the data; and an output circuit (14) for accepting the output data at a predetermined period after the receipt of data by the input circuit. Preferably, the predetermined period is at least as long as the delay in data flow.

10 Claims, 2 Drawing Sheets

GLITCH-ELIMINATOR CIRCUIT

FIELD OF THE INVENTION

The present invention is related to digital circuitry and more specifically to a digital circuit for providing a glitch-free input to other digital circuitry.

BACKGROUND OF THE INVENTION

Digital data glitches are unwanted deviations in a data. A few causes of glitches are noise, crosstalk coupled from other lines, and transients caused by logic gates. Glitches on an input to an asynchronous sequential machine can be a serious problem. In the asynchronous environment, inputs are not validated by a periodic clock signal as they are in a synchronous state machine. In an asynchronous machine a glitch can cause: a false path to be taken, premature movement to the next state, or worst of all, oscillations or lock-up of the machine.

Glitches can occur in combinational logic unless special steps are taken to prevent them. Since most modern designs are synchronous, good synchronous design practices prevent these glitches from being a problem (i.e. no gated docks, path delay analysis for dock period determination, etc.).

Designers of asynchronous logic typically solve the glitch problem by constraining the number of inputs that can change simultaneously to one. Once constrained to single simultaneous bit changes, the designer must implement combinational logic that covers all prime implicants. Changing this combinational logic in this way is undesirable since it increases the size and delay of the circuit. This greatly limits the application of asynchronous sequential machines.

Alternately, if the bus which has multiple bit changes is coming from a synchronous domain, the single bit combinational result can be clocked. This eliminates the glitch but requires the asynchronous sequential machine to wait for the next clock. If the combinational logic is faster than the clock period, waiting is unnecessary.

One aspect of the present invention is to reduce the combinational logic required to interface combinational logic to asynchronous sequential machines. Another aspect of the present invention is to provide a performance enhancement for the multiple simultaneous bit changes for asynchronous sequential machines. Another aspect of the present invention is a digital circuit which can provide a glitch-free output for data going from a synchronous environment to an asynchronous environment or from an asynchronous environment to another asynchronous environment.

SUMMARY OF THE INVENTION

One embodiment of the present invention is a digital circuit for providing glitch-free data in an asynchronous environment, the circuit comprising: an input circuit for accepting data; combinational logic circuitry for accepting the data from the input circuit and manipulating the data to provide output data, wherein a delay in data flow occurs while the combinational logic manipulates the data; and an output circuit for accepting the output data at a predetermined duration after the receipt of data by the input circuit. Preferably, the predetermined duration is at least as long as the delay in data flow.

Another embodiment of the present invention is a digital circuitry for providing a glitch-free output in an asynchronous environment, the circuit comprising: pulse forming circuitry (preferably either an AND gate and an inverting delay element, or a NAND gate, an inverting delay element, and an inverter) for creating an asynchronous pulse, the asynchronous pulse having a first edge and a second edge and a finite duration; an input circuit, preferably a D flip-flop, for accepting data based on the receipt of the first edge of the asynchronous pulse; combinational logic circuitry for accepting data from the input circuit and manipulating the data to provide output data, wherein the outputting of data is delayed while the combinational logic circuitry manipulates the data; and an output circuit, preferably a D latch, for preventing data from changing at its output between the first and second edges of the pulse. Preferably, the finite duration of the asynchronous pulse is at least as long as the delay of outputting the data by the combinational logic circuitry.

Another embodiment of the present invention is a digital circuit for providing glitch-free data in an asynchronous environment, the digital circuit comprising: an input circuit, preferably a D flip-flop, for accepting data upon receipt of an edge of an asynchronous pulse, the asynchronous pulse having a first edge, a second edge, and a finite duration between the first and second edges; combinational logic circuitry for accepting the data from the input circuit and manipulating the data to provide output data, wherein a delay in data flow occurs while the combinational logic circuitry manipulates the data; a delay circuit for delaying the asynchronous pulse for a period at least as long as the delay of data flow, and wherein the delayed asynchronous pulse is defined by a first delayed edge and a second delayed edge; and an output circuit, preferably a D flip-flop, for accepting the output data upon the receipt of a delayed edge of the delayed asynchronous pulse.

DETAILED DESCRIPTION OF PREFERRED EMBODIMENTS

Figure 1:
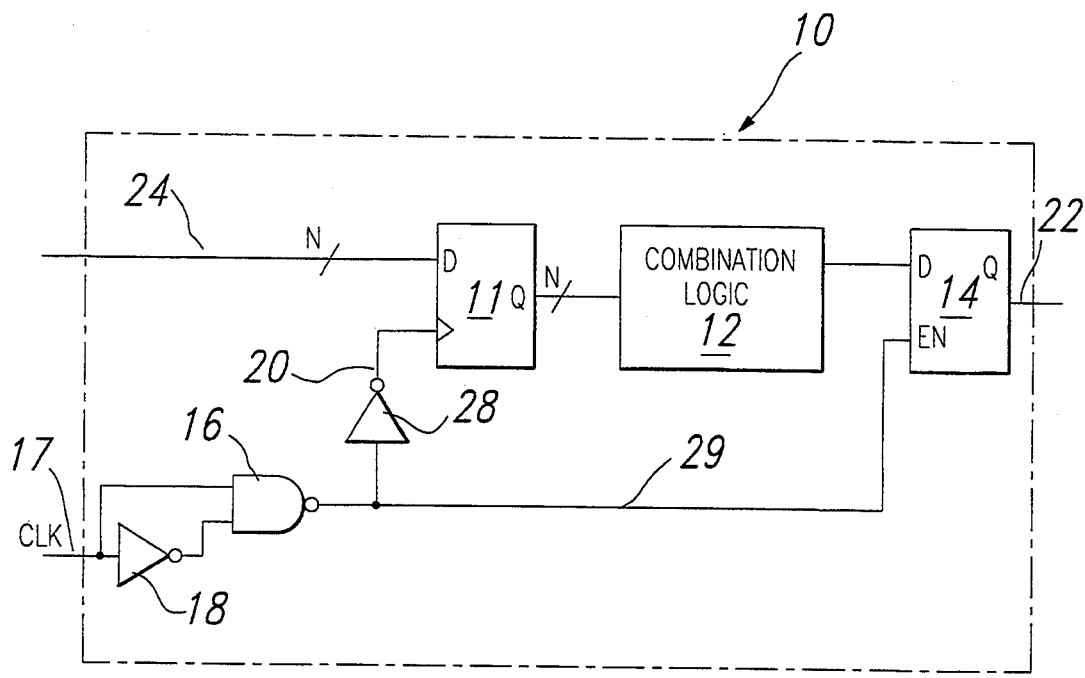
FIG. 1 is a circuit level diagram of a first preferred embodiment of the present invention.

FIG. 1 is a circuit level diagram of a preferred embodiment of the present invention. Data is input into circuit 10 by data line(s) 24, which is N-bits wide. As is shown in FIG. 1, data line(s) 24 is, preferably, connected to the D input of D flip-flop 11. Line 17 carries a clock or a strobe signal, CLK, into the input of inverting delay element 18 and into one of the two inputs of NAND gate 16. The second input of NAND gate 16 is connected to the output of inverting delay element 18. The output of NAND gate 16 is connected to the input of inverter 28 and the output of inverter 28 is connected to an input of block 11, preferably the clocking input of the D flip-flop(s). The output of NAND gate 16 is also connected to an input of block 14, preferably the enable input of a D latch. The output of block 11 is connected to the input of combinational logic block 12, preferably a comparator or a decoder, via an N-bit wide line. The output of combinational logic block 12 is connected to one of the two inputs of block 14, preferably the D input of a D latch. Line 22 is connected to the output of block 14.

Figure 2:
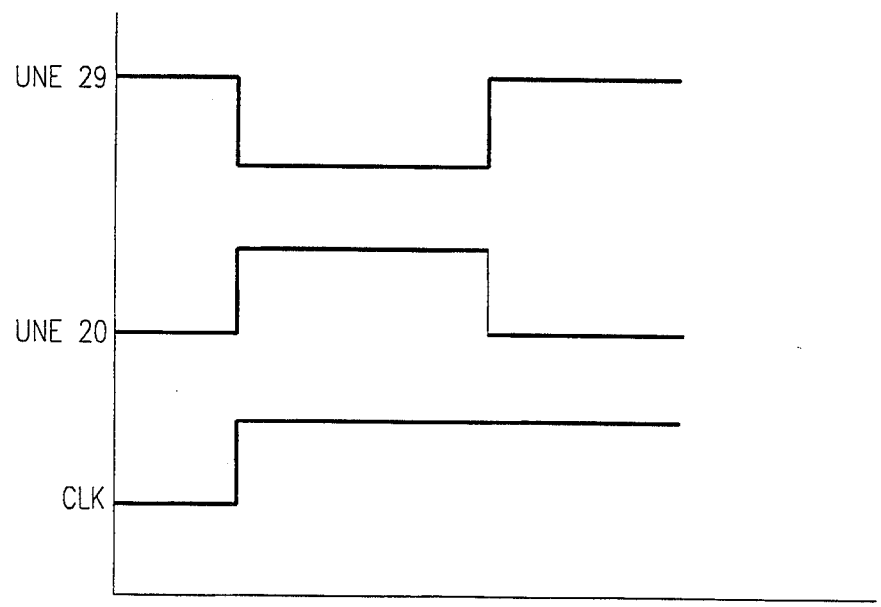
FIG. 2 is a timing diagram which relates to the circuit of FIG. 1.

Now referring to FIG. 2, a clock signal, CLK, is input into inverting delay element 18 and NAND gate 16, simultaneously. When the CLK signal is low, also referred to as logic 0, the output of inverting delay element 18 is high, also referred to as logic 1, thus, resulting in one input of NAND gate 16 being high and the other being low. Once the CLK signal goes high, the input of NAND gate 16 connected only to the CLK signal goes high and the output of inverting delay element 18 also remains high for the designed delay time of the delay element and then goes low. The inverting delay element 18 is designed to create a delay greater than or equal to the set-up time of block 14 plus the delay through combinational block 12 plus the delay from block 11. The output of NAND gate 16 remains low while the output of inverting delay element 18 remains high (due to the delay in the inverter) and CLK remains high. When the CLK signal transitions to a logic 1, block 11 is clocked so that the data at the input of block 11 appears at the output of block 11. Block 14 is enabled while the output of NAND gate 16 is high. The output value is held by block 14 while the output of NAND gate 16 is low. The result of this is that the data output by combinational logic block 12 is blocked by block 14 until line 29 goes high. By not allowing the data output from the combinational logic block 12 to be output on line 22 until after the longest possible propagation delay of combinational logic block 12, any glitches that are created by input changes into combinational block 12 are blocked from the output on line 22.

Figure 3:
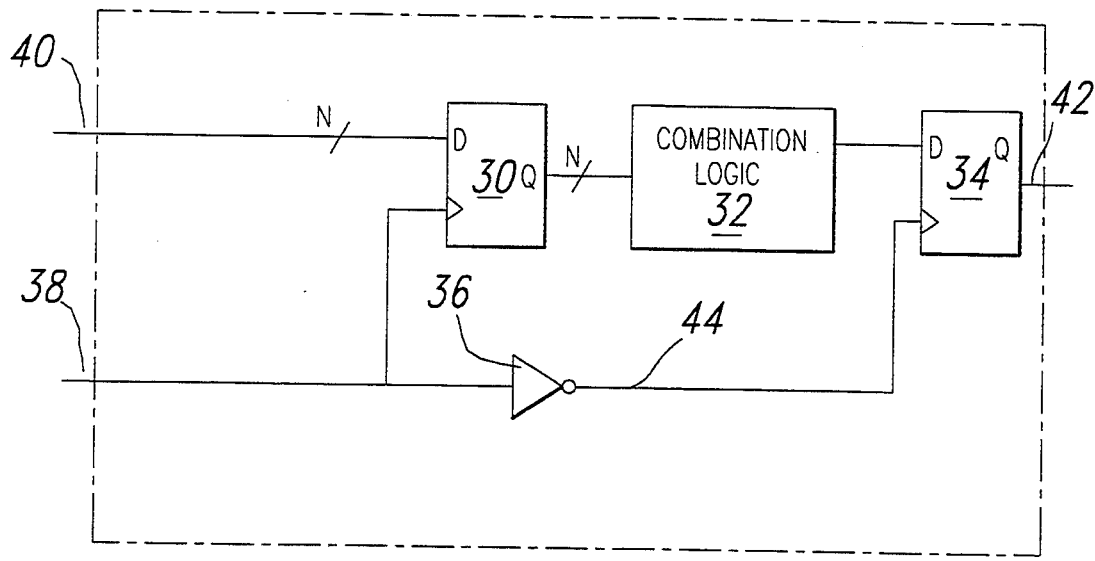
FIG. 3 is a circuit level diagram of a second preferred embodiment of the present invention.

FIG. 3 is an alternative embodiment of the present invention. N-bit wide data line 40 is connected to the input of block 30, preferably the input to a D flip-flop, and clock/strobe line 38 is connected to the clock input of block 30. Clock/strobe line 38 is also connected to the input of delay buffer 36. The output of block 30 is connected to the input of combinational logic block 32. Block 34 has two inputs and is preferably a D flip-flop. The D input of block 34 is connected to the output of combinational logic block 32, the clock input is connected to the output of delay buffer 36 via line 44, and the Q output is connected to output line 42.

Figure 4:
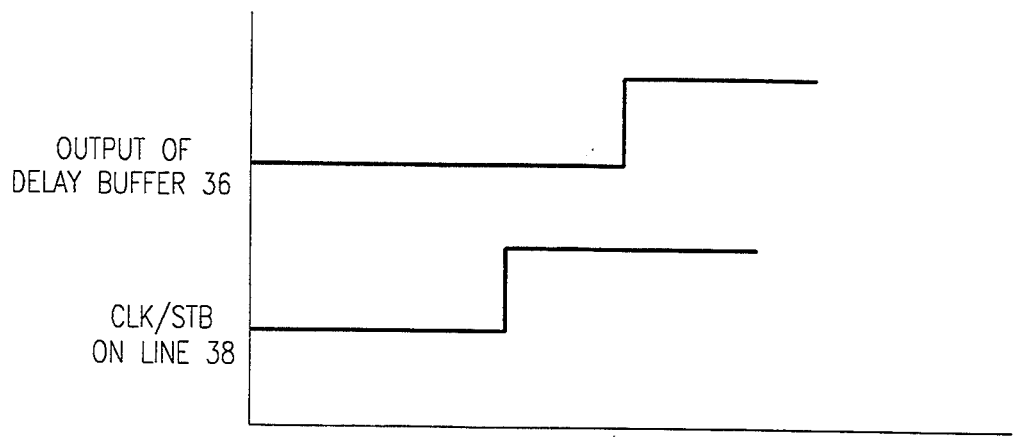
FIG. 4 is a timing diagram which relates to the circuit of FIG. 3.

FIG. 4 is a timing diagram associated with the second preferred embodiment. A clock/strobe signal, CLK/STB, is supplied to the circuit of FIG. 3 via line 38 to enable blocks 30 and 34. When the CLK/STB signal, shown in FIG. 4, transitions to a logic 1 level, block 30 is clocked to accept data and provide the data to combinational logic block 30. The duration that the CLK/STB signal remains at a logic level 0 is extended for a period in time equal to the longest propagation delay that data will experience through combinational logic block 32 by delay buffer 36. The resultant signal, denoted by "output of delay buffer 36" in FIG. 4, is input into block 34, preferably the clock input of a D flip-flop. When this resultant signal transitions to a logic 1 level, block 34 is enabled to accept data from combinational logic block 32 and output the data via line 42. The data output on line 42 will be free of glitches due to acceptance of data by block 34 only after a predetermined period.

Preferably the data input to the present invention comes from an synchronous circuit (such as a processor, registers, or some form of combinational logic circuitry) via an N-bit wide bus. The output of the present invention is preferably a single bit and output to an asynchronous sequential circuit. In one example, the input to the present invention would be two sets of numbers. The combinational logic circuit of the present invention would be a comparator which would compare the two numbers. The output of the present invention would then be a single bit which would designate the larger/smaller of the two numbers.

Although the invention has been described with reference to a preferred embodiment and an alternative embodiment herein, this description is not to be construed in a limiting sense. Various modifications of the disclosed embodiments will become apparent to persons skilled in the art upon reference to the herein description. It is therefore contemplated that the appended claims will cover any such modifications or embodiments as fall within the true scope of the invention.

What is claimed is:

1. A digital circuit for providing a glitch-free output in an asynchronous environment, said circuit comprising:

pulse forming circuitry for creating an asynchronous pulse, said asynchronous pulse having a first edge, a second edge, and a finite duration between said first and said second edges;

an input circuit for accepting input data based on the receipt of the first edge of the asynchronous pulse;

combinational logic circuitry for accepting data from said input circuit and manipulating said data from said input circuit to provide output data, wherein the outputting of data is delayed while said combinational logic circuitry manipulates said data from said input circuit; and an output circuit for blocking said data output by said combinational logic circuitry during said finite duration of said asynchronous pulse;

wherein said finite duration of said asynchronous pulse is at least as long as said delay of outputting said data by said combinational logic circuitry and said input data is not directly received by said combinational logic circuitry.

2. The digital circuitry of claim 1 wherein said input circuit is a D flip-flop.

3. The digital circuitry of claim 1 wherein said output circuit is a D latch.

4. The digital circuit of claim 1 wherein said pulse forming circuitry includes: an AND gate and an inverting delay element.

5. The digital circuit of claim 1, wherein said pulse forming circuitry includes: a NAND gate, an inverter, and an inverting delay element.

6. A digital circuit for providing glitch-free data in an asynchronous environment, said digital circuit comprising:

an input circuit for accepting input data upon receipt of an edge of an asynchronous signal, said asynchronous signal having an edge;

combinational logic circuitry for accepting said data from said input circuit and manipulating said data from said input circuit to provide output data, wherein a delay in data flow occurs while said combinational logic circuitry manipulates said data from said input circuit;

a delay circuit for delaying said asynchronous signal for a period at least as long as said delay of data flow, and wherein said delayed asynchronous signal has a delayed edge; and an output circuit for accepting said output data upon the receipt of a delayed edge of said delayed asynchronous pulse;

wherein said combinational logic circuitry receives exclusively from said input circuitry.

7. The digital circuit of claim 6 wherein said input circuit is a D flip-flop.

8. The digital circuit of claim 6 wherein said output circuit is a D flip-flop.

9. A digital circuit for providing a glitch-free output in an asynchronous environment, said circuit comprising:

pulse forming circuitry for creating an asynchronous pulse, said asynchronous pulse having a first edge, a second edge, and a finite duration between said first and said second edges;

an input circuit for accepting input data based on the receipt of the first edge of the asynchronous pulse;

combinational logic circuitry for accepting data exclusively from said input circuit and manipulating said data from said input circuit to provide output data, wherein the outputting of data is delayed while said combinational logic circuitry manipulates said data from said input circuit; and an output circuit for retaining said data output by said combinational logic circuitry during said finite duration of said asynchronous pulse;

wherein said finite duration of said asynchronous pulse is at least as long as said delay of outputting said data by said combinational logic circuitry.

10. A digital circuit for providing a glitch-free output in an asynchronous environment, said circuit comprising:

pulse forming circuitry for creating an asynchronous pulse, said asynchronous pulse having a first edge, a second edge, and a finite duration between said first and said second edges;

an input circuit for accepting input data based on the receipt of the first edge of the asynchronous pulse, said input data is exclusively received by said input circuit;

combinational logic circuitry for accepting data from said input circuit and manipulating said data from said input circuit to provide output data, wherein the outputting of data is delayed while said combinational logic circuitry manipulates said data from said input circuit; and an output circuit for retaining said data output by said combinational logic circuitry during said finite duration of said asynchronous pulse;

wherein said finite duration of said asynchronous pulse is at least as long as said delay of outputting said data by said combinational logic circuitry.

* * * * *